(12) United States Patent
Lii

(10) Patent No.: US 9,406,779 B2
(45) Date of Patent: Aug. 2, 2016

(54) SPACER SHAPER FORMATION WITH CONFORMAL DIELECTRIC FILM FOR VOID FREE PMD GAP FILL

(71) Applicant: Texas Instruments Incorporated, Dallas, TX (US)

(72) Inventor: Tom Lii, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/746,009

(22) Filed: Jun. 22, 2015

(65) Prior Publication Data

US 2015/0287804 A1    Oct. 8, 2015

Related U.S. Application Data

(62) Division of application No. 13/906,500, filed on May 31, 2013, now Pat. No. 9,093,303.

(60) Provisional application No. 61/673,645, filed on Jul. 19, 2012.

(51) Int. Cl.
| | | |
|---|---|---|
| H01L 21/8238 | (2006.01) | |
| H01L 29/66 | (2006.01) | |
| H01L 27/092 | (2006.01) | |
| H01L 21/8234 | (2006.01) | |
| H01L 21/31 | (2006.01) | |
| H01L 21/311 | (2006.01) | |
| H01L 29/423 | (2006.01) | |
| H01L 29/51 | (2006.01) | |

(52) U.S. Cl.
CPC ............ *H01L 29/6656* (2013.01); *H01L 21/31* (2013.01); *H01L 21/31105* (2013.01); *H01L 21/31111* (2013.01); *H01L 21/8238* (2013.01); *H01L 21/823425* (2013.01); *H01L 21/823807* (2013.01); *H01L 21/823814* (2013.01); *H01L 21/823828* (2013.01); *H01L 21/823835* (2013.01); *H01L 21/823857* (2013.01); *H01L 21/823864* (2013.01); *H01L 27/092* (2013.01); *H01L 29/42364* (2013.01); *H01L 29/512* (2013.01); *H01L 29/518* (2013.01)

(58) Field of Classification Search
CPC .................. H01L 21/823814; H01L 21/8238; H01L 21/823828; H01L 29/518
USPC ......................................................... 438/199
See application file for complete search history.

(56) References Cited

U.S. PATENT DOCUMENTS

| | | | | |
|---|---|---|---|---|
| 5,888,588 | A * | 3/1999 | Nagabushnam | ........ C23C 16/34 257/E21.2 |
| 6,214,679 | B1 | 4/2001 | Murthy et al. | |
| 7,545,001 | B2 * | 6/2009 | Cheng | ............. H01L 21/823814 257/357 |

(Continued)

FOREIGN PATENT DOCUMENTS

KR    10 2009 0070771 A    7/2009

*Primary Examiner* — Theresa T Doan
(74) *Attorney, Agent, or Firm* — Jacqueline J. Garner; Frank D. Cimino

(57) ABSTRACT

An integrated circuit may be formed by removing source/drain spacers from offset spacers on sidewalls of MOS transistor gates, forming a contact etch stop layer (CESL) spacer layer on lateral surfaces of the MOS transistor gates, etching back the CESL spacer layer to form sloped CESL spacers on the lateral surfaces of the MOS transistor gates with heights of ¼ to ¾ of the MOS transistor gates, forming a CESL over the sloped CESL spacers, the MOS transistor gates and the intervening substrate, and forming a PMD layer over the CESL.

11 Claims, 6 Drawing Sheets

(56) References Cited

U.S. PATENT DOCUMENTS

| | | |
|---|---|---|
| 7,618,856 B2 | 11/2009 | Ting et al. |
| 2005/0260806 A1 | 11/2005 | Chang et al. |
| 2008/0173947 A1 | 7/2008 | Hou et al. |
| 2008/0308873 A1 | 12/2008 | Chen et al. |
| 2010/0279459 A1 | 11/2010 | Huang et al. |

\* cited by examiner

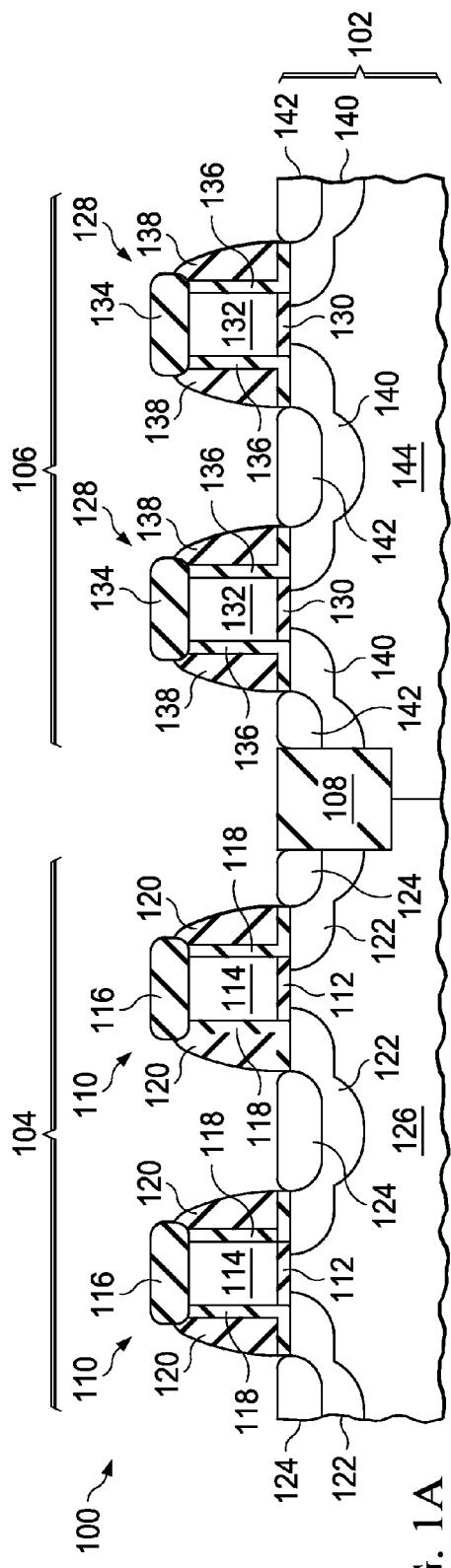
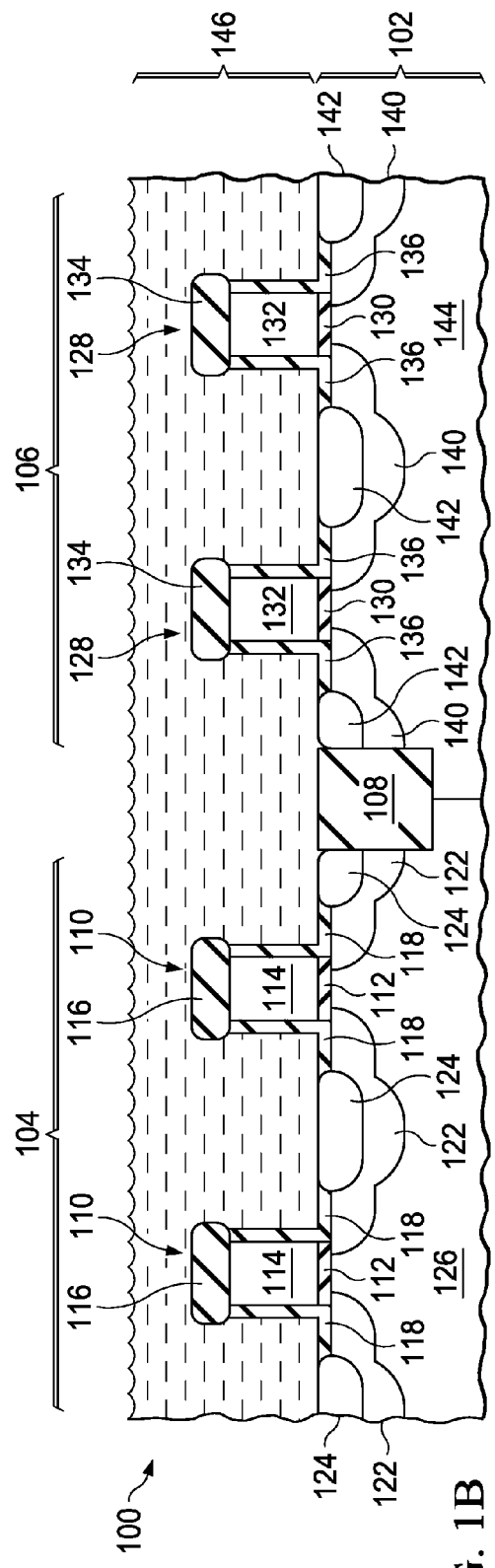
FIG. 1A
FIG. 1B

US 9,406,779 B2

SPACER SHAPER FORMATION WITH CONFORMAL DIELECTRIC FILM FOR VOID FREE PMD GAP FILL

CROSS-REFERENCE TO RELATED APPLICATIONS

This application is a divisional of U.S. Nonprovisional patent application Ser. No. 13/906,500, filed May 31, 2013, and claims the priority of U.S. Provisional Patent Application Ser. No. 61/673,645, filed Jul. 19, 2012, the contents of which are herein incorporated by reference in its entirety.

FIELD OF THE INVENTION

This invention relates to the field of integrated circuits. More particularly, this invention relates to dielectric layers in integrated circuits.

BACKGROUND OF THE INVENTION

Integrated circuits fabricated using advanced complementary metal oxide semiconductor (CMOS) technology node features and processes may have metal silicide which overhangs the gate sidewall spacer and high aspect ratio openings between closely spaced gates. Forming the pre-metal dielectric (PMD) layer without voids in the high aspect ratio openings may be problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit may be formed by removing source/drain spacers from offset spacers on sidewalls of metal oxide semiconductor (MOS) transistor gates, forming a contact etch stop layer (CESL) spacer layer on lateral surfaces of the MOS transistor gates, etching back the CESL spacer layer to form sloped CESL spacers on the lateral surfaces of the MOS transistor gates with heights of ¼ to ¾ of the MOS transistor gates, forming a CESL over the sloped CESL spacers, the MOS transistor gates and the intervening substrate, and forming a PMD layer over the CESL.

DESCRIPTION OF THE VIEWS OF THE DRAWING

FIG. 1A through FIG. 1I are cross sections of an exemplary integrated circuit depicted in successive stages of fabrication.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit may be formed by removing source/drain spacers from offset spacers on sidewalls of MOS transistor gates, forming a CESL spacer layer on lateral surfaces of the MOS transistor gates, etching back the CESL spacer layer to form sloped CESL spacers on the lateral surfaces of the MOS transistor gates with heights of ¼ to ¾ of the MOS transistor gates, forming a CESL over the sloped CESL spacers, the MOS transistor gates and substrate between the gates, and forming a PMD layer over the CESL.

The CESL spacer layer may include a first sublayer of silicon dioxide and a second sublayer of silicon nitride. Alternatively, the CESL spacer layer may be substantially all silicon dioxide.

Figure 1C:
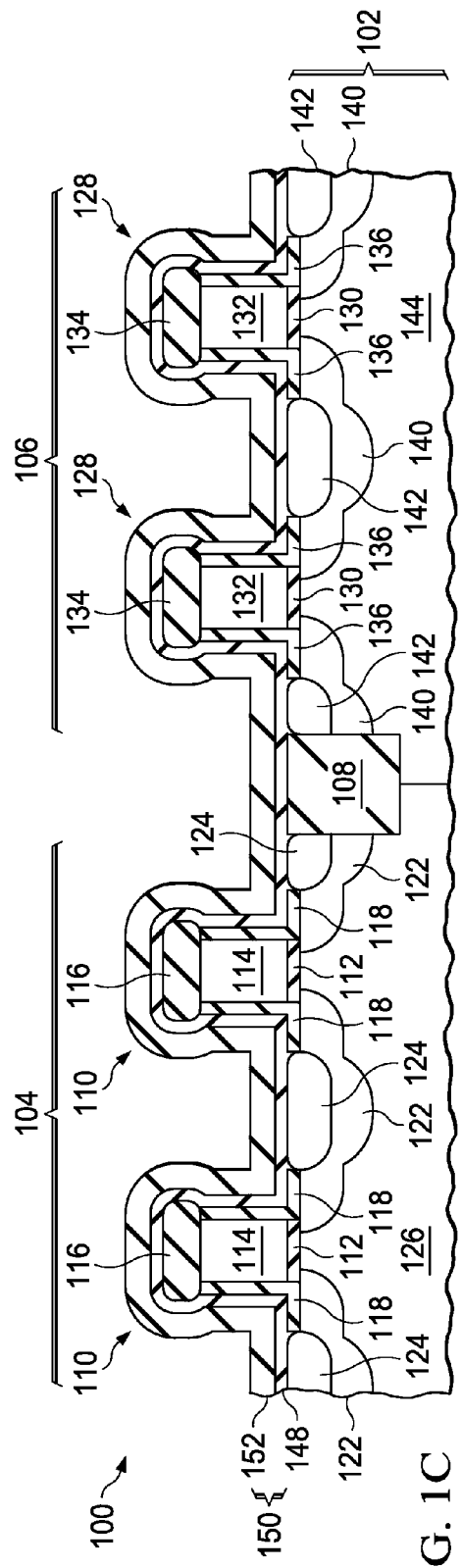

FIG. 1A through FIG. 1I are cross sections of an exemplary integrated circuit depicted in successive stages of fabrication. Referring to FIG. 1A, the integrated circuit 100 is formed in and on a semiconductor substrate 102 such as a single crystal silicon wafer, a silicon-on-insulator (SOI) wafer, a hybrid orientation technology (HOT) wafer with regions of different crystal orientations, or other material appropriate for fabrication of the integrated circuit 100. The integrated circuit 100 includes a p-channel metal oxide semiconductor (PMOS) transistor region 104, and an n-channel metal oxide semiconductor (NMOS) transistor region 106. The integrated circuit 100 may include field oxide 108 at a top surface of the substrate 102 to laterally isolate components of the integrated circuit 100.

The PMOS transistor region 104 includes a plurality of PMOS gate structures 110 disposed proximate to each other. The PMOS gate structures 110 may be gates of a single multi-finger PMOS transistor or may be gates of separate transistors such as occurs in a NOR gate in a static random access memory (SRAM) cell. Each of the PMOS gate structures 110 may include a gate dielectric layer 112 at the top surface of the substrate 102, a gate 114 for example of polysilicon on the gate dielectric layer 112, a layer of metal silicide 116 on the gate 114, and gate offset spacers 118 of silicon dioxide and silicon nitride on lateral surfaces of the gate 114. Source/drain spacers 120 of silicon nitride are formed on lateral surfaces of the gate offset spacers 118. P-type source/drain (PSD) regions 122 are formed in the substrate 102 adjacent to and underlapping the PMOS gate structures 110. Metal silicide 124 is formed at the top surface of the substrate 102 over the PSD regions 122. The PMOS transistor region 104 is formed in an n-type well 126 of the substrate 102.

Correspondingly, the NMOS transistor region 106 includes a plurality of NMOS gate structures 128 disposed proximate to each other. The NMOS gate structures 128 may be gates of a single multi-finger NMOS transistor or may be gates of separate transistors such as occurs in a NAND gate or in an SRAM cell. Each of the NMOS gate structures 128 may include a gate dielectric layer 130 at the top surface of the substrate 102, a gate 132 also of polysilicon on the gate dielectric layer 130, a layer of metal silicide 134 on the gate 132, and gate offset spacers 136 of silicon dioxide and silicon nitride on lateral surfaces of the gate 132. Source/drain spacers 138 of silicon nitride are formed on lateral surfaces of the gate offset spacers 136. N-type source/drain (NSD) regions 140 are formed in the substrate 102 adjacent to and underlapping the NMOS gate structures 128. Metal silicide 142 is formed at the top surface of the substrate 102 over the NSD regions 140. The NMOS transistor region 106 is formed in a p-type well 144 of the substrate 102.

In one version of the instant example, the gates 114 of the PMOS gate structures 110 may have gate lengths less than 50 nanometers, and be disposed with less than 100 nanometers between adjacent instances of the gates 114 of the PMOS gate structures 110. Similarly, the gates 132 of the NMOS gate structures 128 may have gate lengths less than 50 nanometers, and be disposed with less than 100 nanometers between adjacent instances of the gates 132 of the NMOS gate structures 128.

Referring to FIG. 1B, a source/drain spacer etch process removes the source/drain spacers 120 of the PMOS transistor region 104 and the source/drain spacers 138 of the NMOS transistor region 106 of FIG. 1A. The source/drain spacer etch process may include, for example, a wet etch step in which the integrated circuit 100 is exposed to an aqueous phosphoric acid solution 146 at 140° C. to 170° C., as depicted in FIG. 1B. Other processes for removing the source/drain spacers 120 and 138, such as an isotropic plasma etch using fluorine and oxygen radicals, are within the scope of the instant example. The gate offset spacers 118 of the PMOS transistor region 104 and the gate offset spacers 136 of the NMOS transistor region 106 are not completely removed by the source/drain spacer etch process.

Referring to FIG. 1C, a first sublayer 148 of a CESL spacer layer 150 is formed on an existing top surface of the integrated circuit 100. In the instant example, the first sublayer 148 may be silicon dioxide. The first sublayer 148 may be formed, for example, using a sub-atmospheric chemical vapor deposition (SACVD) process and be substantially conformal on the PMOS gate structures 110 and the NMOS gate structures 128. The first sublayer 148 may be, for example, 3 to 7 nanometers thick on lateral surfaces of the gate offset spacers 118 of the PMOS transistor region 104 and the gate offset spacers 136 of the NMOS transistor region 106.

A second sublayer 152 of the CESL spacer layer 150 is formed on the first sublayer 148. In one version of the instant example, the second sublayer 152 may be silicon nitride. The silicon nitride version of the second sublayer 152 may be formed by a plasma enhanced chemical vapor deposition (PECVD) process using silane and ammonia gases, or may be formed using a multi-station sequential deposition process similar to atomic layer deposition (ALD), such as the Novellus Conformal Film Deposition (CFD) process. In another version of the instant example, the second sublayer 152 may be silicon carbide, formed by a PECVD process or by a multi-station sequential deposition process. The second sublayer 152 may be, for example, 12 to 17 nanometers thick laterally adjacent to the gate offset spacers 118 and 136.

Figure 1D:
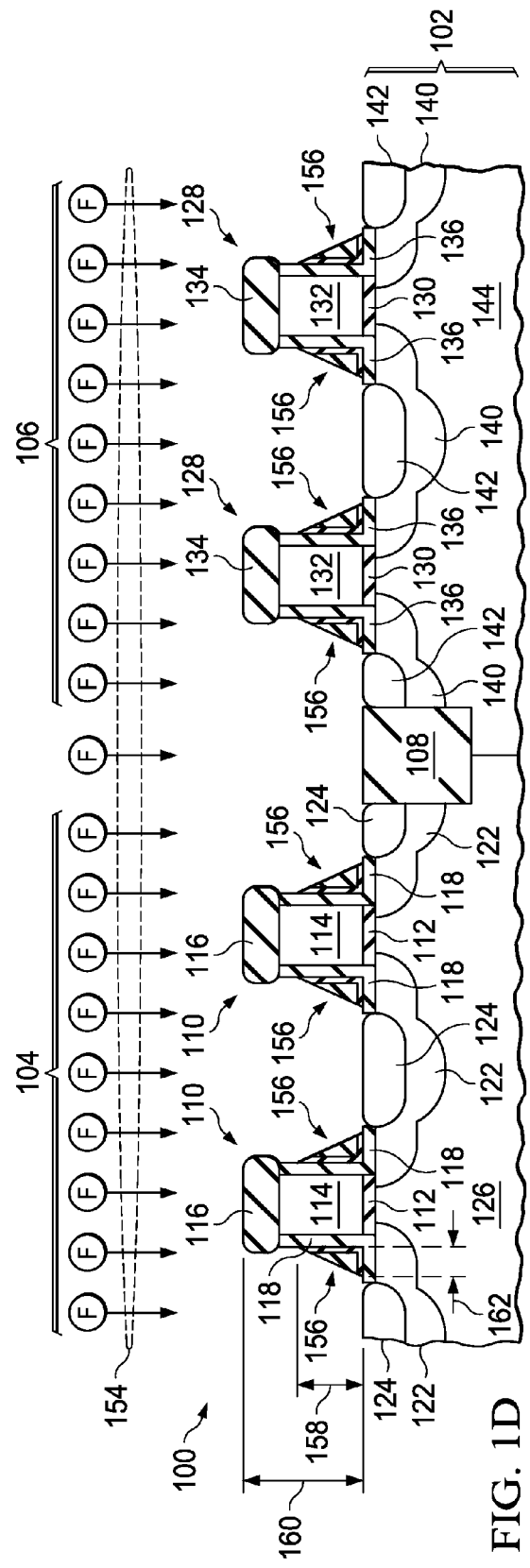

Referring to FIG. 1D, an anisotropic reactive ion etch (RIE) process 154 using fluorine radicals and oxygen removes the CESL spacer layer 150 of FIG. 1C from top surfaces of the PMOS gate structures 110 and the NMOS gate structures 128 and from portions of an existing top surface of the integrated circuit 100 between the PMOS gate structures 110 and the NMOS gate structures 128, leaving the CESL spacer layer 150 on lateral surfaces of the PMOS gate structures 110 and the NMOS gate structures 128 to form sloped CESL spacers 156 which have a height 158 of ¼ to ¾ of a height 160 of the PMOS gate structures 110 and the NMOS gate structures 128. The sloped CESL spacers 156 may have a width 162 of 5 to 15 nanometers at bottoms of the sloped CESL spacers 156. Forming the CESL spacer layer 150 to include the first sublayer 148 of silicon dioxide and the second sublayer 152 of silicon nitride may provide a desired shape to the sloped CESL spacers 156.

Figure 1E:
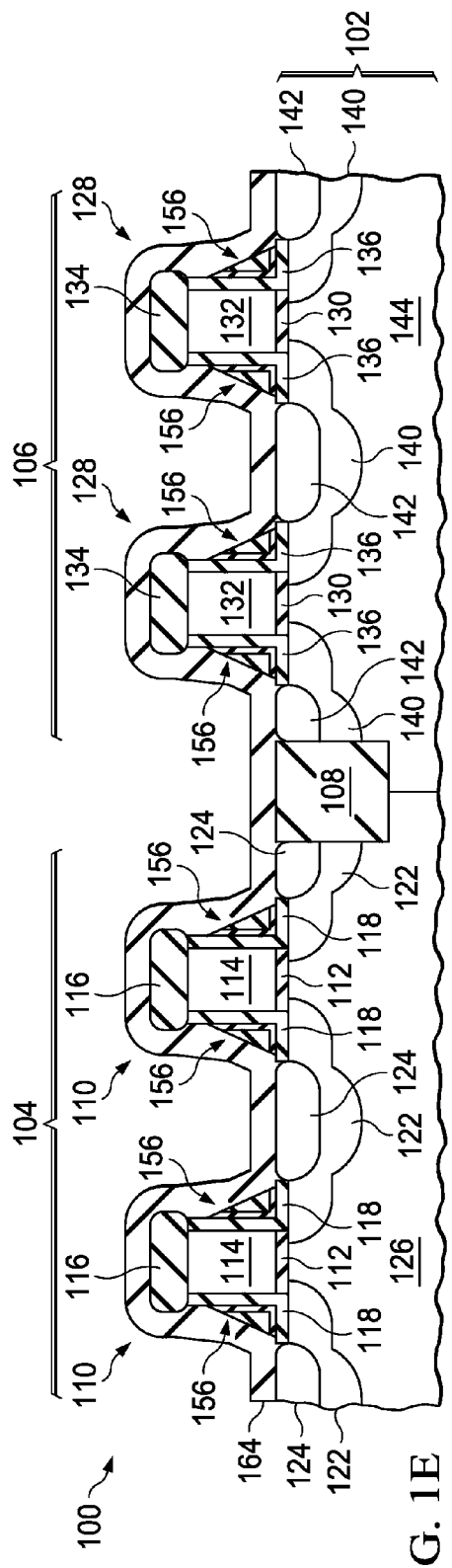

Referring to FIG. 1E, a CESL 164 is formed over an existing top surface of the integrated circuit 100. The CESL 164 may be, for example, 15 to 30 nanometers thick. Due to presence of the sloped CESL spacers 156, the CESL 164 has no reentrant surface profiles between the PMOS gate structures 110 or between the NMOS gate structures 128. Reentrant surface profiles have wider separations between facing surfaces of the CESL 164 closer to the substrate 102 over the PSD regions 122 or over the NSD regions 140. The CESL 164 may include one or more layers of silicon nitride and may possibly include silicon dioxide. In one version of the instant example, the CESL 164 may have a compressive stress greater than 100 megapascals, which may desirably enhance drive current of the PMOS transistor region 104.

Figure 1F:
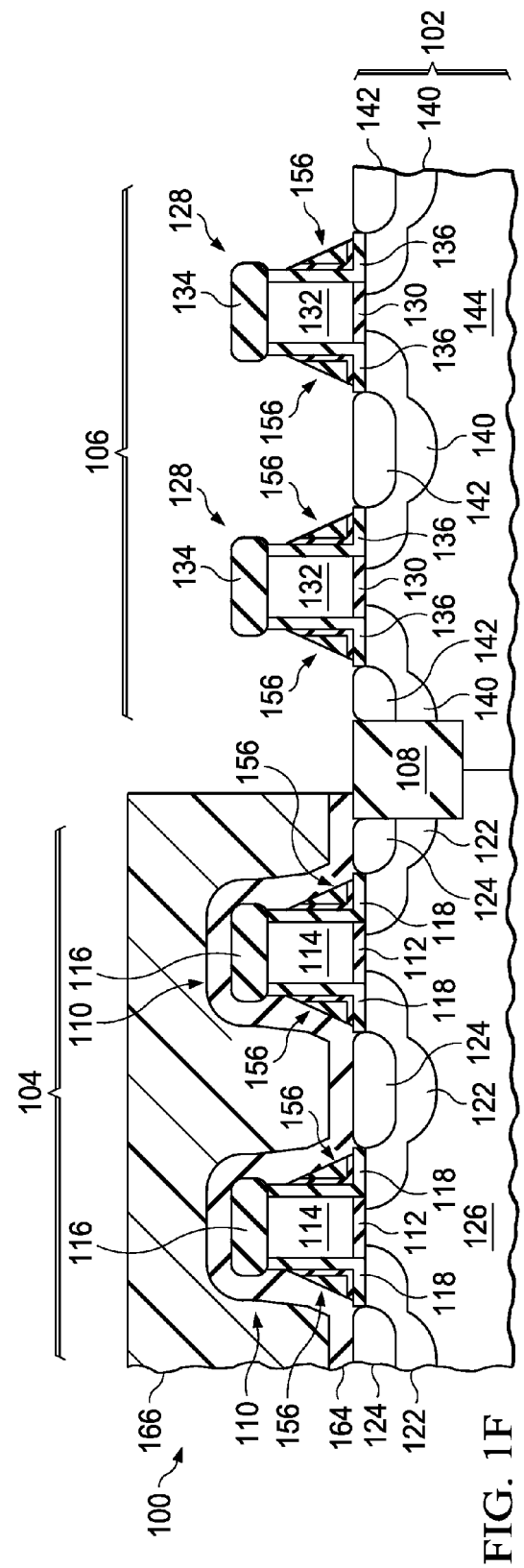
Figure 1G:
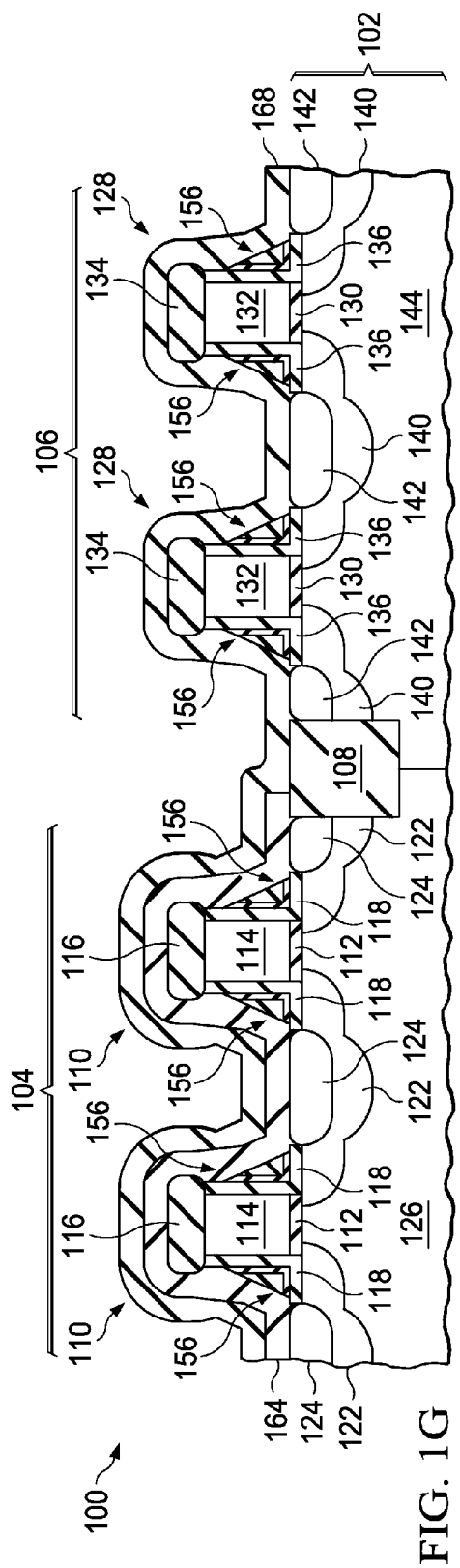
Figure 1H:
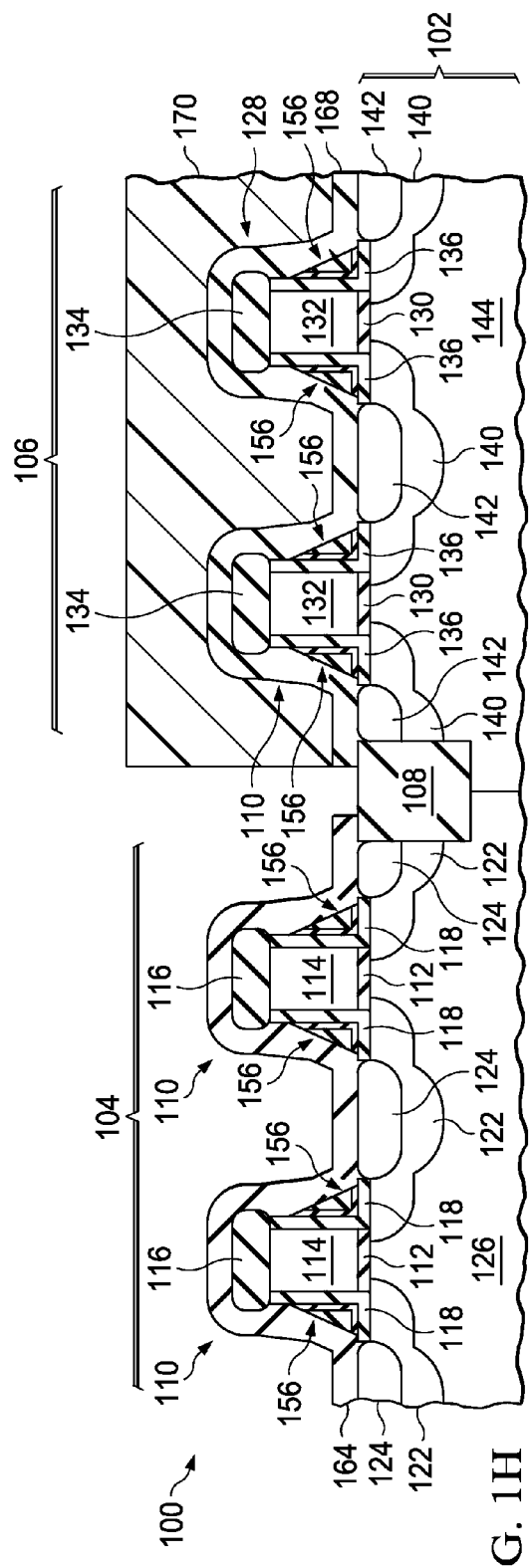

FIG. 1F through FIG. 1H depict optional additional fabrication steps of the integrated circuit 100, in which the CESL 164 of FIG. 1E is a first CESL 164, and a second CESL is formed. Referring to FIG. 1F, a first CESL etch mask 166 is formed over the PMOS transistor region 104 so as to expose the first CESL 164 over the NMOS transistor region 106. The first CESL etch mask 166 may include photoresist and be formed by a photolithographic process. Subsequently, a first CESL etch process removes at least a majority portion of the first CESL 164 over the NMOS transistor region 106. The first CESL etch process may include an RIE step using fluorine radicals and oxygen. The first CESL etch mask 166 is removed after the first CESL etch process is completed.

Referring to FIG. 1G, a second CESL 168 is formed over the first CESL 164 and over the NMOS transistor region 106. The second CESL 168 may be, for example, 15 to 30 nanometers thick. Due to presence of the sloped CESL spacers 156, the second CESL 168 has no reentrant surface profiles between the PMOS gate structures 110 or between the NMOS gate structures 128. The second CESL 168 may include one or more layers of silicon nitride and may possibly include silicon dioxide. In one version of the instant example, the second CESL 168 may have a tensile stress greater than 100 megapascals, which may desirably enhance drive current of the NMOS transistor region 106.

Referring to FIG. 1H, a second CESL etch mask 170 is formed over the NMOS transistor region 106 so as to expose the second CESL 168 over the PMOS transistor region 104. The second CESL etch mask 170 may include photoresist and be formed by a photolithographic process, similarly to the first CESL etch mask 166 of FIG. 1F. Subsequently, a second CESL etch process removes at least a majority portion of the second CESL 168 over the PMOS transistor region 104. The second CESL etch process may include an RIE step using fluorine radicals and oxygen, similarly to the CESL etch process discussed in reference to FIG. 1F. The second CESL etch mask 170 is removed after the second CESL etch process is completed.

Figure 1I:
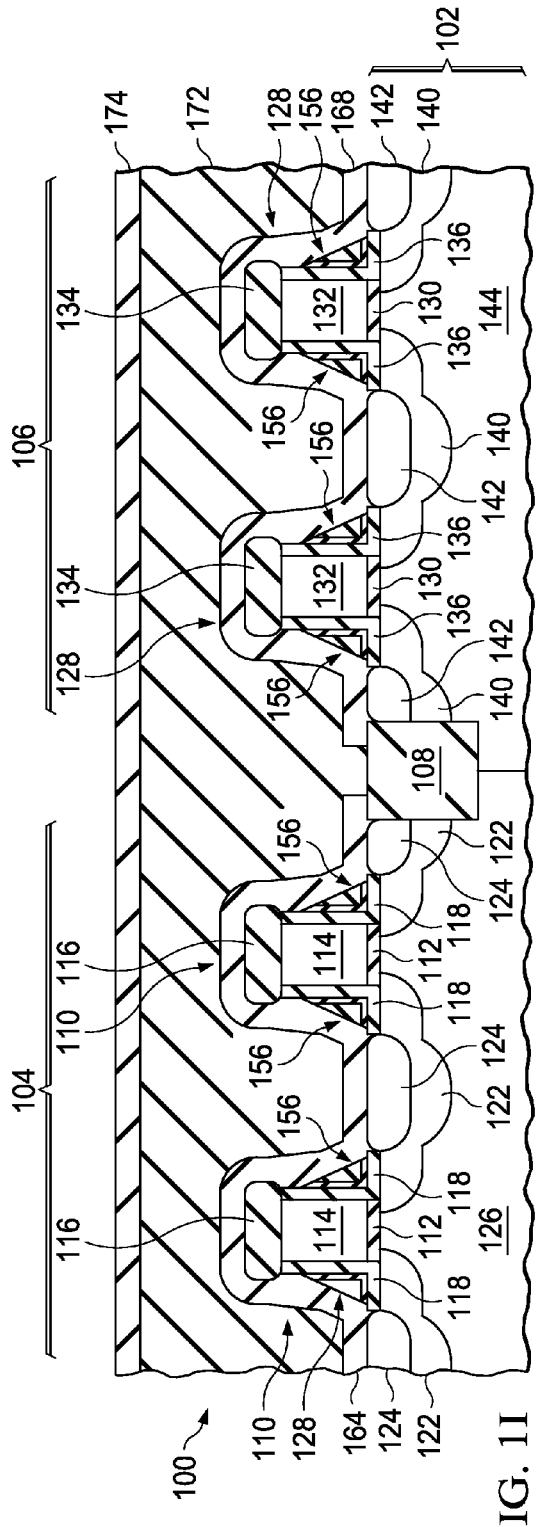

Referring to FIG. 1I, a PMD layer 172 is formed over an existing top surface of the integrated circuit 100, including the first CESL 164 and the second CESL 168 if present. The PMD layer 172 may include, for example, a layer of silicon dioxide, phospho-silicate glass (PSG) or boro-phospho-silicate glass (BPSG), 100 to 1000 nanometers thick deposited by PECVD, and leveled by a chemical-mechanical polish (CMP) process. An optional PMD cap layer 174 may be formed over the PMD layer 172. The PMD cap layer 174 may be 10 to 100 nanometers of a hard material such as silicon nitride, silicon carbide nitride or silicon carbide. Because the first CESL 164 and the second CESL 168 have no reentrant surface profiles between the PMOS gate structures 110 and between the NMOS gate structures 128, the PMD layer 172 may advantageously be free of voids between the PMOS gate structures 110 and between the NMOS gate structures 128.

It will be recognized that in one version of the instant example, the integrated circuit 100 may be formed by the steps described in reference to FIG. 1A through FIG. 1E and subsequently FIG. 1H, that is, with the second CESL 168. It will also be recognized that in an alternate version, the integrated circuit 100 may be formed by the steps described in reference to FIG. 1A through FIG. 1G and subsequently FIG. 1H, that is, with a blanket configuration of the second CESL 168. It will further be recognized that a relative order of formation of the first CESL 164 and the second CESL 168 may be reversed from the order described in reference to FIG. 1E through FIG. 1H.

Figure 2A:
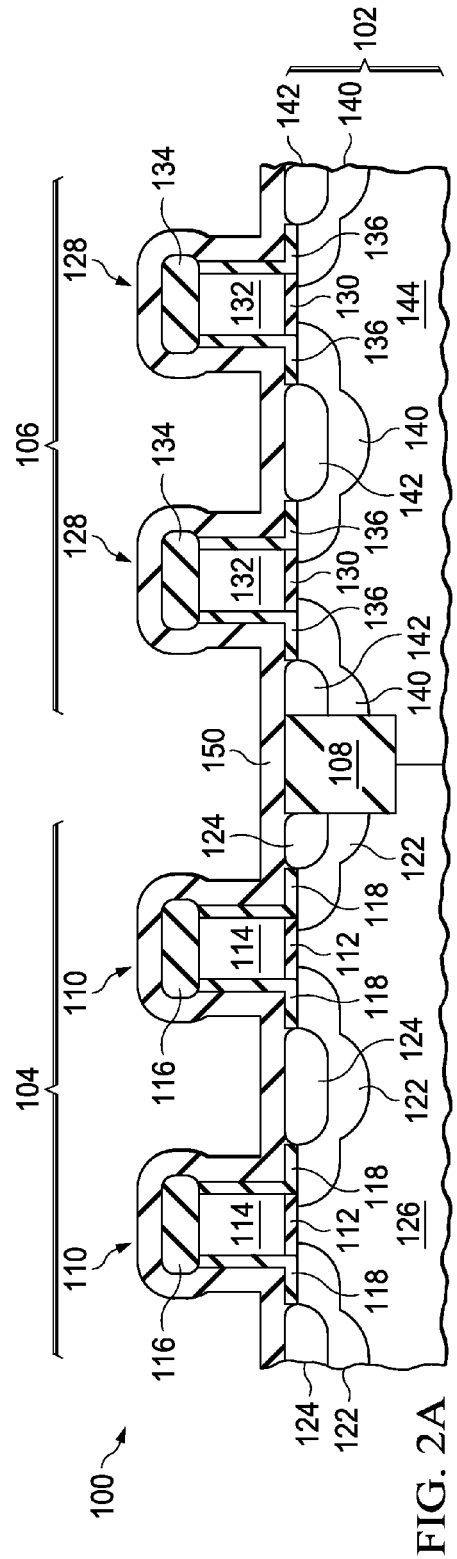
FIG. 2A and FIG. 2B are cross sections of the integrated circuit, depicting an alternate process sequence for formation of the CESL spacers.
Figure 2B:
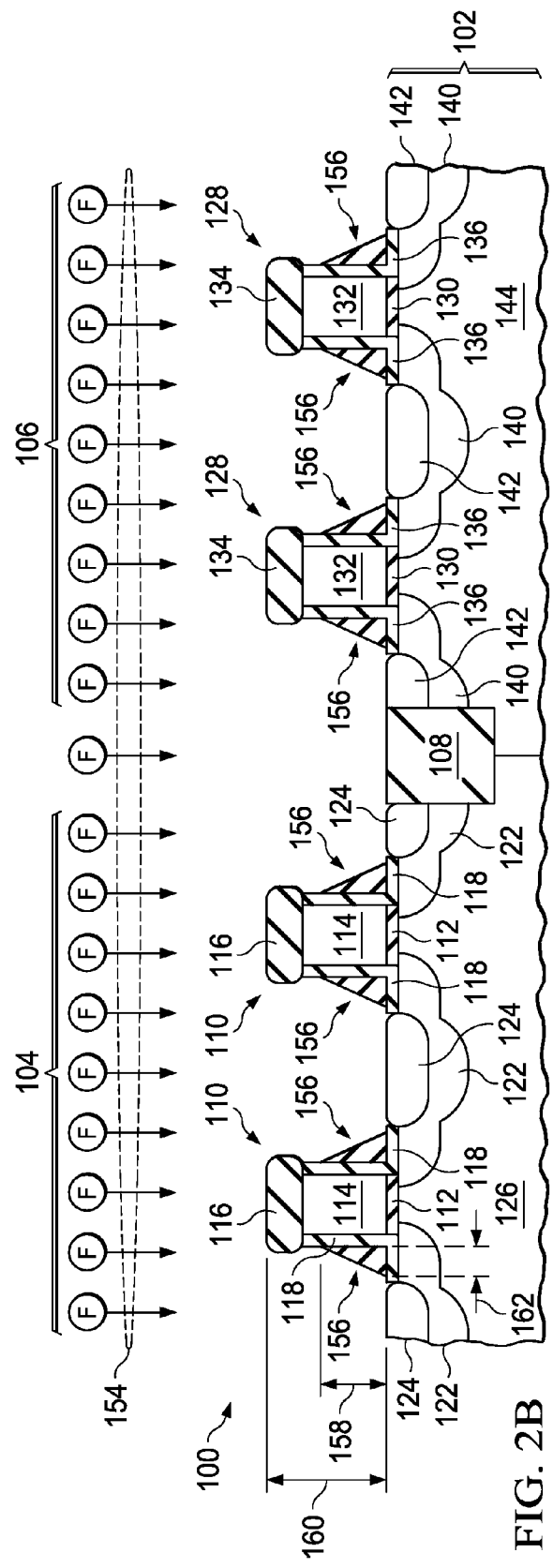

FIG. 2A and FIG. 2B are cross sections of the integrated circuit 100, depicting an alternate process sequence for formation of the sloped CESL spacers 156 from the sequence depicted in FIG. 1C and FIG. 1D. Referring to FIG. 2A, the CESL spacer layer 150 is formed as a homogeneous layer of silicon dioxide, 15 to 25 nanometers thick, over an existing top surface of the integrated circuit 100. The CESL spacer layer 150 may be formed by an SACVD process or by an ALD process. Forming the CESL spacer layer 150 of a homogeneous layer of silicon dioxide may desirable reduce fabrication cost and complexity of the integrated circuit 100.

Referring to FIG. 2B, the anisotropic RIE process 154 using fluorine radicals removes the CESL spacer layer 150 of FIG. 2A from top surfaces of the PMOS gate structures 110 and the NMOS gate structures 128 and from portions of an existing top surface of the integrated circuit 100 between the PMOS gate structures 110 and the NMOS gate structures 128, leaving the CESL spacer layer 150 on lateral surfaces of the PMOS gate structures 110 and the NMOS gate structures 128 to form the sloped CESL spacers 156 which have a height 158 of ¼ to ¾ of a height 160 of the PMOS gate structures 110 and the NMOS gate structures 128. The sloped CESL spacers 156 may have a width 162 of 5 to 15 nanometers.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming an integrated circuit, comprising the steps of:
    providing a semiconductor substrate;
    forming a plurality of PMOS gate structures disposed proximate to each other;
    forming a plurality of NMOS gate structures disposed proximate to each other;
    forming source/drain spacers on lateral surfaces of gate offset spacers of said PMOS gate structures;
    forming source/drain spacers on lateral surfaces of gate offset spacers of said NMOS gate structures;
    removing said source/drain spacers from said PMOS gate structures and said source/drain spacers from said NMOS gate structures;
    forming a CESL spacer layer over an existing top surface of said integrated circuit, including over said PMOS gate structures and said NMOS gate structures;
    performing an anisotropic reactive ion etch (RIE) process which removes said CESL spacer layer from top surfaces of said PMOS gate structures and said NMOS gate structures and from portions of said existing top surface of said integrated circuit between said PMOS gate structures and said NMOS gate structures, leaving said CESL spacer layer on lateral surfaces of said PMOS gate structures and said NMOS gate structures so as to form sloped CESL spacers which have a height of ¼ to ¾ of a height of said PMOS gate structures and said NMOS gate structures;
    forming a CESL over said PMOS gate structures and said sloped CESL spacers on said lateral surfaces of said gate offset spacers of said PMOS gate structures, said CESL comprising silicon nitride, said CESL being free of reentrant surface profiles between said PMOS gate structures; and
    forming a PMD layer over said CESL.

2. The method of claim 1, in which said step of forming said CESL spacer layer comprises the steps of:
    forming a first sublayer of silicon dioxide abutting said gate offset spacers of said PMOS gate structures and said gate offset spacers of said NMOS gate structures; and
    forming a second sublayer of silicon nitride disposed on said first sublayer.

3. The method of claim 2, in which said step of forming said first sublayer includes a sub-atmospheric chemical vapor deposition (SACVD) process.

4. The method of claim 2, in which said step of forming said second sublayer includes a plasma enhanced chemical vapor deposition (PECVD) process using silane and ammonia gases.

5. The method of claim 2, in which said step of forming said second sublayer includes a multi-station sequential deposition process.

6. The method of claim 2, in which:
    said step of forming said first sublayer is performed so that said first sublayer has a thickness of 3 to 7 nanometers; and
    said step of forming said second sublayer is performed so that said second sublayer has a thickness of 12 to 17 nanometers.

7. The method of claim 1, in which said step of forming said CESL spacer layer comprises forming a homogeneous layer of silicon dioxide abutting said gate offset spacers of said PMOS gate structures and said gate offset spacers of said NMOS gate structures.

8. The method of claim 7, in which said step of forming said homogeneous layer is performed so that said homogeneous layer has a thickness of 15 to 25 nanometers.

9. The method of claim 1, in which said step of performing said anisotropic RIE process is performed so that said sloped CESL spacers have a width of 5 to 15 nanometers at bottoms of said sloped CESL spacers.

10. The method of claim 1, in which said CESL is a first CESL and said step of forming said CESL is performed so that CESL is formed over said NMOS gate structures and said sloped CESL spacers on said lateral surfaces of said gate offset spacers of said NMOS gate structures, said CESL being free of reentrant surface profiles between said NMOS gate structures, and further comprising the steps of:

forming a CESL etch mask over said first CESL over said plurality of PMOS gate structures so as to expose said first CESL over said plurality of NMOS gate structures;

removing at least a majority portion of said first CESL over said plurality of NMOS gate structures while said CESL etch mask is in place;

removing said CESL etch mask; and forming a second CESL over said NMOS gate structures and said sloped CESL spacers on said lateral surfaces of said gate offset spacers of said NMOS gate structures, said second CESL comprising silicon nitride, said second CESL being free of reentrant surface profiles between said NMOS gate structures, prior to said step of forming said PMD layer.

11. The method of claim 1, in which step of removing said source/drain spacers is performed with a wet etch of aqueous phosphoric acid.

* * * * *